United States Patent [19]

Kita et al.

[11] Patent Number: 4,735,915
[45] Date of Patent: Apr. 5, 1988

[54] METHOD OF MANUFACTURING A SEMICONDUCTOR RANDOM ACCESS MEMORY ELEMENT

[75] Inventors: Akio Kita; Masayoshi Ino, both of Tokyo, Japan

[73] Assignee: Oki Electric Indutry Co., Ltd., Tokyo, Japan

[21] Appl. No.: 884,667

[22] Filed: Jul. 16, 1986

Related U.S. Application Data

[62] Division of Ser. No. 627,725, Jul. 3, 1984, abandoned.

[30] Foreign Application Priority Data

Jul. 5, 1983 [JP] Japan ................... 58-120947

[51] Int. Cl.⁴ ................... H01L 21/04; H01L 21/22
[52] U.S. Cl. ................... 437/52; 437/59; 437/60; 437/69; 437/160
[58] Field of Search ................... 29/571, 57 GJ, 577 C, 29/576 C; 148/DIG. 14, DIG. 105, 188; 357/23.6, 54, 51

[56] References Cited

U.S. PATENT DOCUMENTS

| | | | |
|---|---|---|---|
| 4,270,262 | 2/1981 | Hori et al. | 29/571 |
| 4,322,881 | 4/1982 | Enomoto et al. | 29/571 |
| 4,361,949 | 12/1982 | Hori et al. | 29/571 |
| 4,403,394 | 9/1983 | Shepard et al. | 29/571 |
| 4,419,743 | 12/1983 | Taguchi et al. | 357/23.6 |
| 4,426,764 | 1/1984 | Kosa et al. | 29/571 |
| 4,432,006 | 2/1984 | Takei | 357/23.6 |
| 4,510,670 | 4/1985 | Schwabe et al. | 357/67.5 |
| 4,551,742 | 11/1985 | Takemoto et al. | 357/23.6 |
| 4,569,700 | 2/1986 | Toyama | 29/576 J |

FOREIGN PATENT DOCUMENTS

| | | | |
|---|---|---|---|
| 108390 | 5/1984 | European Pat. Off. | 357/23.6 |
| 2720533 | 11/1978 | Fed. Rep. of Germany | 29/571 |
| 2728927 | 1/1979 | Fed. Rep. of Germany | 357/23.6 |
| 0090279 | 7/1977 | Japan | 29/571 |
| 55-22881 | 2/1980 | Japan | 357/23.6 |
| 0154762 | 12/1980 | Japan | |
| 56-8871 | 1/1981 | Japan | 357/23.6 |
| 57-112066 | 7/1982 | Japan | 357/23.6 |
| 59-78561 | 5/1984 | Japan | 357/23.6 |

OTHER PUBLICATIONS

Bailey, "Thin Film Multilayer Capacitors Using Pynolytically Deposited S102", IEEE Trans. on Parts, Hybrids, and Packaging, vol. PHP-1, No. 4, pp. 361-364-Dec. 1976.

Koyanagi, "Novel High Density, Stacked Capacitor MOS RAM", Japanese J. of Applied Physics, vol. 18 (79), Supplement 18-1, pp. 35-42.

Anzubi, "Metal Oxide Semiconductor Capacitor", IBM TD 13, vol. 17, No. 6, Nov. 74, 1569-1570.

"NSC Forges Ahead with Triple-Poly Rams," Electronics, Jun. 30, 1981, p. 42.

N. Lu, "High Cap. O-Ram . . . ," IBM Tech. Discl. Bull., vol. 26, #3B, Aug. 1983, pp. 1318-1322.

Primary Examiner—Brian E. Hearn
Assistant Examiner—Tom Thomas
Attorney, Agent, or Firm—Wenderoth, Lind & Ponack

[57] ABSTRACT

The semiconductor memory element comprises two capacitors and a switching MOS transistor. A first capacitor is constituted by a silicon semiconductor substrate, a thin oxide film and a first doped polycrystalline silicon layer, and a second capacitor is constituted by a second doped polycrystalline silicon layer, a thin oxide film between the first and the second doped polycrystalline silicon layers, and the first polycrystalline silicon layer. Interconnection layers necessary to form a single transistor type dynamic memory cell are also provided.

1 Claim, 5 Drawing Sheets

FIG_1  PRIOR ART

FIG_3
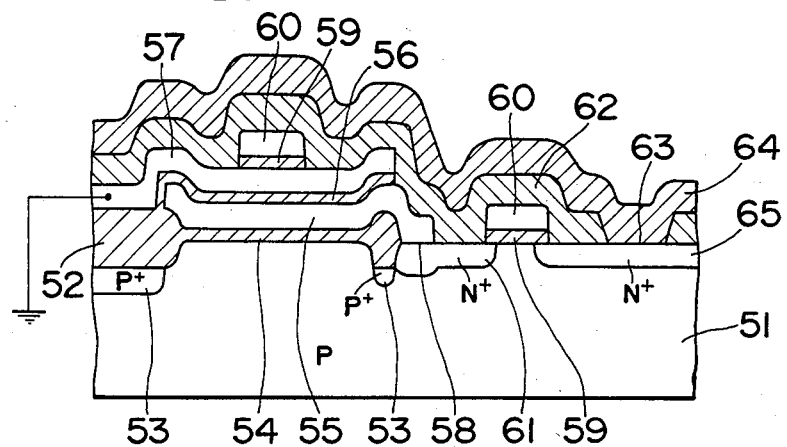
FIG_4
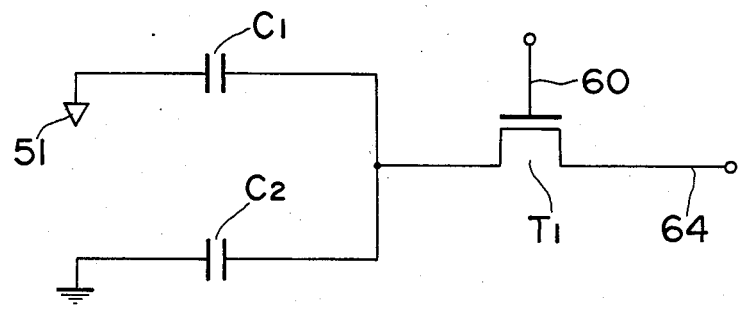

METHOD OF MANUFACTURING A SEMICONDUCTOR RANDOM ACCESS MEMORY ELEMENT

This application is a division of application Ser. No. 627,725 filed July 3, 1984, now abandoned.

BACKGROUND OF THE INVENTION

This invention relates to a semiconductor random access memory (RAM) element capable of providing a large scale integration and a method of manufacturing the same.

FIG. 1 is a sectional view showing a prior art standard one transistor dynamic RAM element or cell which comprises one memory capacitor and a switching MOS transistor.

The dynamic RAM cell is formed on a semiconductor substrate 1 including a thick field oxide film 2 and a channel stopping layer 3. The memory capacitor for storing information comprises a thin insulating film 4 and a metal plate 5. The switching MOS transistor also comprises a gate insulating film 6, a gate electrode 7 connected to an address line, a diffused layer 8 connected to one end of the memory capacitor, and a diffused layer 10 connected to a bit line 9.

When an address line is selected, the switching MOS transistor is turned ON, permitting electric charge to flow either into or out of the memory capacitor when read or write selection is actuated.

Recently, the memory cell size per bit is decreasing with years, and 256K bit dynamic RAM devices are ready for being placed on the market.

However, the reduction of the memory cell size has weakened dynamic RAM devices in the immunity to $\alpha$ rays or noise.

Under these conditions, with the prior art memory cell structure, it has been difficult to boost the packing density of IC memory devices without degrading the electrical characteristics.

SUMMARY OF THE INVENTION

An object of this invention is to provide a semi-conductor dynamic memory element capable of providing an increased value of a memory capacitor, and a method of manufacturing the memory element.

According to one aspect of this invention, there is provided a semiconductor random access memory element comprising a silicon semiconductor substrate of one conductivity type; a first dielectric layer placed on a selected surface of the semiconductor substrate; a common conductive plate placed on the surface of the first dielectric layer; a second dielectric layer placed on the surface of the common plate; a second conductive plate placed on the surface of the second dielectric layer; a MOS capacitor region constituted by the semiconductor substrate, the first dielectric layer and the common conductive plate; another capacitor region comprising the common conductive layer, the second dielectric layer and the second conductive plate; and a switching MOS transistor region formed on the semiconductor substrate and adjacent to the capacitor region; the MOS transistor region having a gate electrode being connected to an address conductive line, a drain region being connected to a bit conductive line and a source region being connected to the common conductive plate.

According to another aspect of this invention there is provided a method of manufacturing a semiconductor random access memory element including two storage regions and a switching MOS transistor region, the method comprising the steps of preparing a silicon semiconductor substrate of one conductivity type; forming a field oxide region on the selected surface of the substrate and a channel stopping layer of one conductivity type beneath the oxide region; forming a first dielectric layer on the surface of the substrate; forming a first conductive layer for a common capacitor plate on the surface of the first dielectric layer; forming a second dielectric layer on the surface of the first conductive layer; forming a second conductive layer for another capacitor plate on the surface of the second dielectric layer; applying an insulating film on the surface of an assembly thus obtained; and forming a metal layer on the surface of the insulating film.

BRIEF DESCRIPTION OF THE DRAWINGS

In the accompanying drawings:

FIG. 3 is a sectional view taken along a line III—III in FIG. 2;

FIG. 4 is a circuit diagram showing an equivalent circuit of the semiconductor memory element according to this invention.

DESCRIPTION OF THE PREFERRED EMBODIMENT

Figure 1:
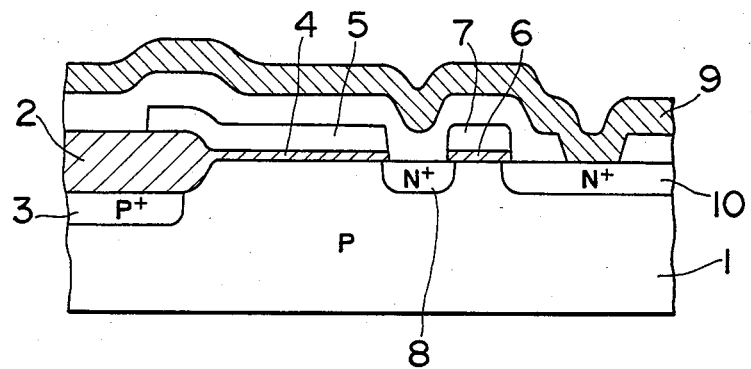
FIG. 1 is a sectional view showing a prior art one transistor type memory cell.
Figure 2:
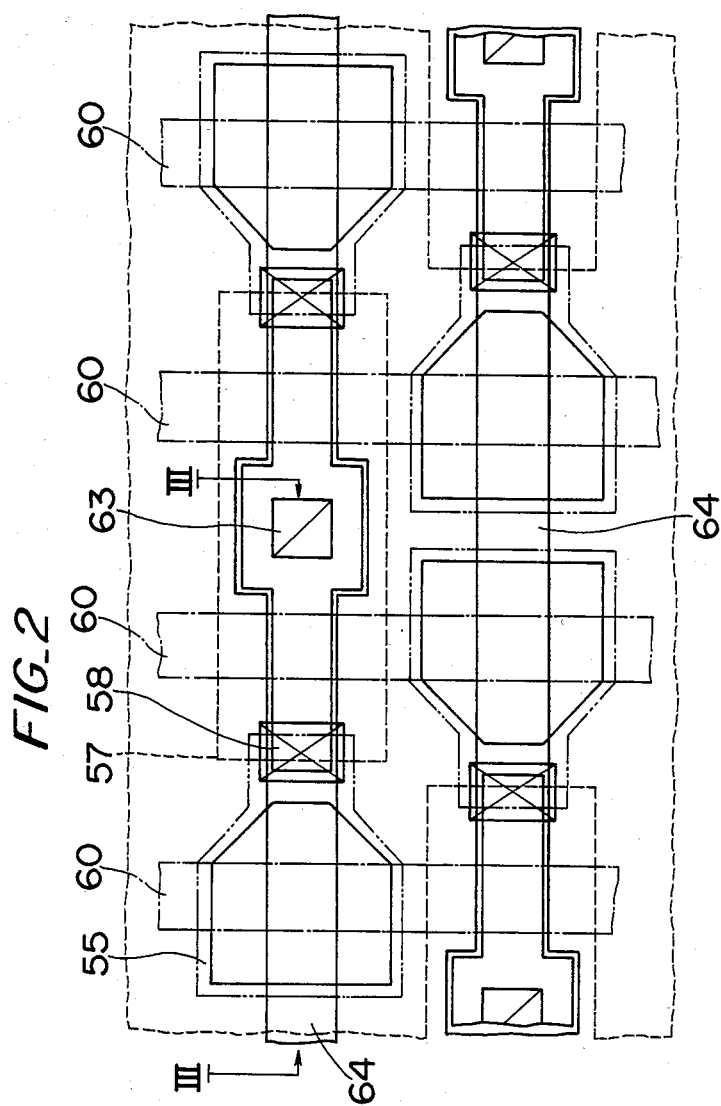
FIG. 2 is a plan view showing one embodiment of the semiconductor memory element according to this invention.

In the embodiment shown in FIGS. 2 and 3, an N-channel silicon gate MOS manufacturing process is used.

In FIG. 3, one transistor dynamic RAM element or cell according to this invention comprises both two memory storage regions and a switching MOS transistor region which are formed on a P-type silicon semiconductor substrate 51 having a thick field oxide region 52 and a channel stopping layer 53. The semiconductor substrate 51 is generally connected to a substrate bias potential.

The storage region is constituted by a lower capacitor $C_1$ and an upper capacitor $C_2$ thereon. The lower capacitor is a MOS capacitor and is formed with a thin dioxide film 54 as a first dielectric layer on the surface of the semiconductor substrate 51 and an impurity doped polycrystalline silicon layer 55 as a common conductive plate on the film 54. The upper capacitor is formed with a thin dioxide film 56 as a second dielectric layer on the polycrystalline silicon layer 55 and an impurity doped polycrystalline silicon layer 57 as a second conductive plate on the layer 56. The polycrystalline silicon layer 57 is connected to the ground potential during operation.

The switching MOS transistor region is formed with a gate oxide ($SiO_2$) 59 on the surface of the silicon substrate 51, an impurity doped polycrystalline silicon gate electrode 60 on the film 59, an N+ diffused region 61 acting as a source region, and an N+ diffused region 65 acting as a drain region. The N+ diffused region 61 is contacted with the end of the polycrystalline silicon layer 55.

A phosphorus silicate glass (PSG) insulating layer 62 is placed on the surfaces of the storage region and MOS transistor region to electrically isolate between conductive layers. An aluminum interconnection 64 acting as a bit line is placed on the surface of the insulating layer 62 and is ohmicly contacted with the N+ diffused region 65 through a hole 63. The polycrystalline silicon gate electrode 60 acts as an address line and extends in the direction perpendicular to the bit line 64 (see FIG. 3).

When an address line is selected, the switching MOS transistor is turned ON to write the voltage on the bit line into the memory capacitors, or to read out on the bit line the charge in the capacitors.

FIG. 4 shows a simplified equivalent circuit of the memory cell shown in FIG. 3.

A method of manufacturing the dynamic memory device described above will now be described with reference to FIGS. 5a–5f in which elements corresponding to those shown in FIGS. 2 and 3 are designated by the same reference numerals. The steps shown in FIGS. 5a–5f utilize an N-channel silicon gate MOS manufacturing process.

Figure 5A:
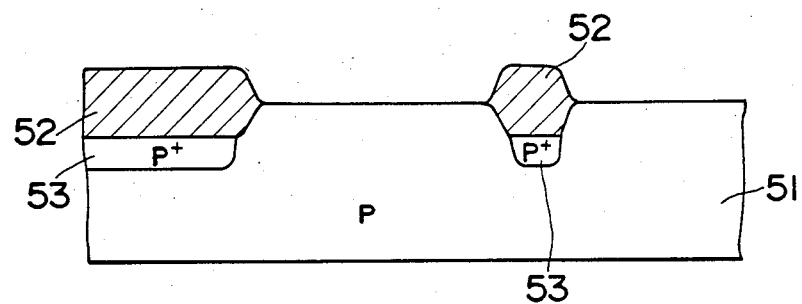
FIGS. 5a through 5f are sectional views showing successive steps of manufacturing the semiconductor memory element of this invention.
Figure 5B:
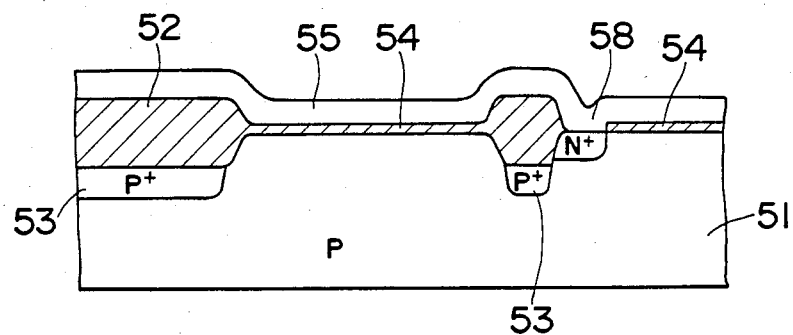
Figure 5C:
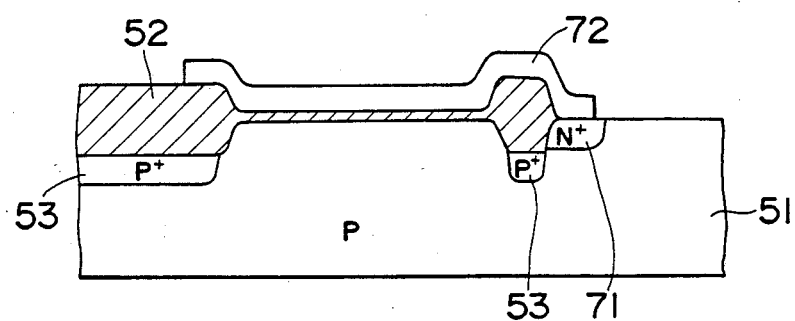
Figure 5D:
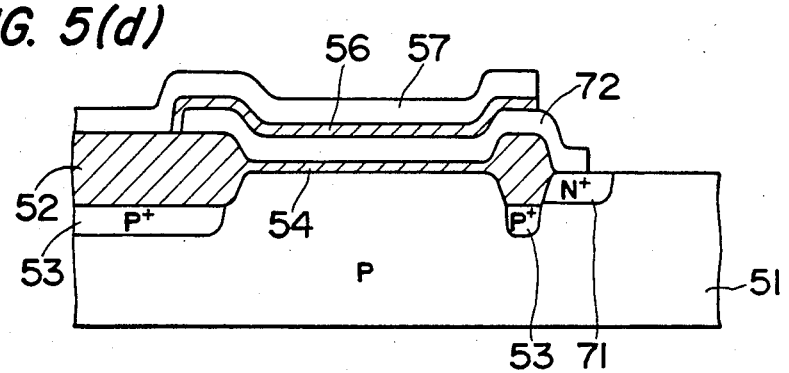
Figure 5E:
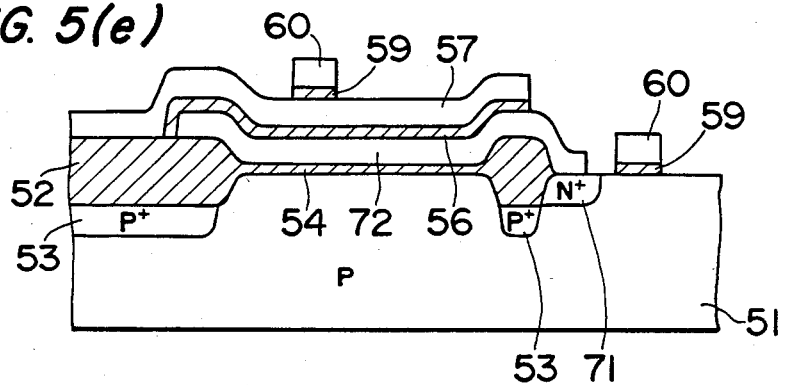
Figure 5F:
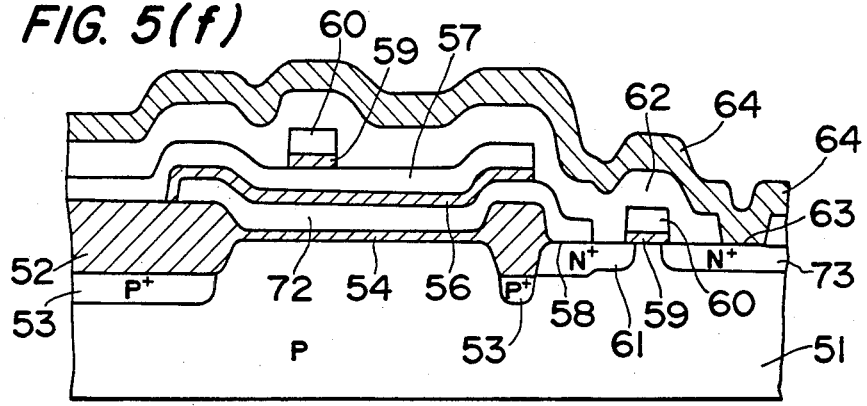

First, in FIG. 5a, a field oxide (SiO$_2$) film 52 is formed on the surface of a P-type silicon substrate 51 by a selective oxidation process, and a P-type channel stopping layer 53 is formed beneath the field oxide film 52 to isolate elements.

Next, a first dielectric layer 54, as a silicon dioxide film, is formed to a thickness of about 2000 Å on the surface of the silicon substrate 51 by a heat oxidation process. Then, a contact hole 58 is formed in the dielectric layer 54 with a photolithography process to expose a selected surface of the silicon substrate 51. Furthermore, a polycrystalline silicon layer 55 is deposited to a thickness of about 3000 Å on the entire surface of the dielectric layer 54 by a chemical vapor deposition (CVD) process and diffused with phosphorus atoms at a high concentration to convert it into a conductive layer, while an N+ diffused region 71 is formed in the silicon substrate 51 (see FIG. 5b).

Next, a common conductive plate 72 is formed by patterning the polycrystalline silicon layer 55 with a conventional photolithography, while an undesired dielectric layer 54 on the surface of the silicon substrate 51 is removed. The conductive plate 72 is in ohmic contact with the N+ diffused region 71 (see FIG. 5c).

Thereafter, a second thin silicon dioxide film is formed on the entire surface of the structure obtained above by a heat oxidation process, and a doped polycrystalline silicon layer is formed on the entire surface of the second dielectric layer by a chemical vapor deposition process. Then, these layers are selectively removed to form a second dielectric layer 56 and a conductive plate 57, while the portion of the silicon substrate 51 is exposed to form a MOS transistor structure (see FIG. 5d).

Next, a third silicon dioxide film is formed on the entire surface of the structure obtained above by a heat oxidation process, and then a third doped polycrystalline silicon layer is formed on the surface of the third dioxide film. The third silicon dioxide and the third doped layers are subjected to a patterning process to form a gate oxide 59 and a polysilicon gate electrode 60 (see FIG. 5e). The third doped polycrystalline silicon layer is used as an address metal line. N+ diffused regions are also formed in the surface of the silicon substrate 51 by implanting arcenic ions wherein the layers 59 and 60 are used as a mask. The region 61 acts as a source region connected to the common conductive plate, and the region 73 a drain region.

Next, an insulating layer 62 of phosphorus silicate glass, for example, is applied on the surface of the structure obtained above. A contact hole 63 is opened to expose the surface of the diffused region 73. Aluminum film is deposited on the entire surface of the insulating layer 62, and then etched off to form a metal bit line 64 in contact with the diffused region 73. Finally, a surface protective film (not shown) is applied on the surface of the structure obtained above.

According to the embodiment described above, since two storage regions are formed in the form of a stucked structure and are connected in parallel to each other, it can provide increased capacitance value per unit area and strong noise immunity.

Moreover, since one conductive plate of the upper memory capacitor is grounded and one conductive plate of the lower memory capacitor is connected to a substrate bias potential, the operating margin (so-called voltage bump characteristics) to the sudden variation in a power source voltage can be improved at the time of writing and reading operations.

A silicon nitride may be used as a dielectric material for the upper capacitor $C_2$ by itself or in combination with a silicon dioxide layer to obtain larger capacitance values. In this case, since the upper capacitor is not a MOS capacitor, the silicon nitride can be easily adopted without taking account of the interface energy level difference at the surface contacting with a semiconductor substrate.

Such silicide having a high melting point as molybdenum silicide may be used in place of polycrystalline silicon, lowering the electrical resistance of the address conductive line to make possible a high speed operation.

What is claimed is:

1. A method of manufacturing a semiconductor random access memory element including a storage region in the form of a stacked structure and an N-type MOS transistor region on a surface of a silicon semiconductor substrate, said method comprising the steps of:
   (a) preparing a silicon semiconductor substrate of a P conductivity type;
   (b) forming first and second field silicon oxide layers on a selected surface of said substrate and a channel stopping layer of a P conductivity type beneath said first and second oxide layers, said first and second oxide layers defining said storage region and said N-type MOS transistor region to be formed;
   (c) forming a first dielectric layer of silicon dioxide on a surface of said storage region;
   (d) depositing a polycrystalline silicon layer on the entire surface of said first dielectric layer by chemical vapor deposition;
   (e) diffusing phosphorous atoms at a high concentration into said polycrystalline silicon layer to convert it a conductive layer, while forming an N+ diffused region contiguous to said second field silicon oxide layer and in said N-type MOS transistor region;
   (f) selectively removing said conductive layer to form a common capacitor plate, one end of said common capacitor plate being electrically in contact with said N+ diffused region;

(g) forming a second dielectric layer of silicon dioxide on a surface of said common capacitor plate;
(h) forming a second conductive plate of doped polycrystalline silicon on the surface of said second dielectric layer, said second conductive layer being in contact with a substrate bias potential;
(i) forming a third silicon dioxide layer on the entire surface of the structure obtained by the step (h);
(j) then forming a third doped polycrystalline silicon layer on the surface of said third silicon dioxide layer;
(k) patterning said third doped polycrystalline silicon layer and said third silicon dioxide layer to form a gate oxide layer and a gate electrode in said MOS transistor region;
(l) forming a source region extending from said N+ region, said a drain region in said MOS transistor region;
(m) applying an insulating layer of phosphorous silicate glass on the surface of the structure obtained by the step (l);
(n) forming a contact aperture in said insulating layer so as to expose a surface of said drain region; and
(o) forming a metal layer acting as a bit line on a surface of said insulating layer, said metal layer being in contact with said drain region.

* * * * *